United States Patent
Minor et al.

(10) Patent No.: US 7,856,939 B2
(45) Date of Patent: Dec. 28, 2010

(54) RECIRCULATION SPIN COATER WITH OPTICAL CONTROLS

(75) Inventors: Lawrence M. Minor, Apollo Beach, FL (US); Lisa Marie Titolo, Tarpon Springs, FL (US); Hung Nguyen, Largo, FL (US); Steve R. Susie, Largo, FL (US)

(73) Assignee: Transitions Optical, Inc., Pinellas Park, FL (US)

( * ) Notice: Subject to any disclaimer, the term of this patent is extended or adjusted under 35 U.S.C. 154(b) by 609 days.

(21) Appl. No.: 11/843,779

(22) Filed: Aug. 23, 2007

(65) Prior Publication Data

US 2008/0047488 A1 Feb. 28, 2008

Related U.S. Application Data

(60) Provisional application No. 60/823,695, filed on Aug. 28, 2006.

(51) Int. Cl.
*B05C 11/02* (2006.01)
(52) U.S. Cl. .......................................... 118/52; 118/320
(58) Field of Classification Search .................. 118/52, 118/320
See application file for complete search history.

(56) References Cited

U.S. PATENT DOCUMENTS

| | | | |
|---|---|---|---|
| 3,494,326 A | 2/1970 | Upton | |
| 5,094,884 A | 3/1992 | Hillman et al. | |
| 5,246,499 A | 9/1993 | Peralta et al. | |
| 5,514,214 A | 5/1996 | Joel et al. | |
| 5,571,560 A | 11/1996 | Lin | |
| 5,685,908 A | 11/1997 | Brytsche et al. | |
| 5,766,354 A | 6/1998 | Ohmori et al. | |
| 5,776,250 A * | 7/1998 | Shin et al. | 118/326 |
| 5,843,527 A * | 12/1998 | Sanada | 427/240 |
| 6,113,697 A * | 9/2000 | Kim et al. | 118/696 |
| 6,129,042 A | 10/2000 | Smith et al. | |
| 6,326,054 B1 | 12/2001 | Smith et al. | |
| 6,352,747 B1 | 3/2002 | Blackburn et al. | |
| 6,599,571 B2 * | 7/2003 | Davis | 427/240 |
| 6,723,168 B2 * | 4/2004 | Kao et al. | 118/52 |
| 6,891,610 B2 * | 5/2005 | Nikoonahad et al. | 356/237.2 |

(Continued)

FOREIGN PATENT DOCUMENTS

JP    2001-223151 A    8/2001

(Continued)

*Primary Examiner*—Parviz Hassanzadeh
*Assistant Examiner*—Albert Hilton
(74) *Attorney, Agent, or Firm*—Deborah M. Altman

(57) ABSTRACT

A recirculation spin coater system includes a spin coating bowl with a having a recirculation drain and a wetting fluid chamber associated with the upper end of the inner side walls wherein the wetting fluid chamber is configured to dispense a side wall wetting fluid to inner side walls of the spin coating bowl. A vision system configured to capture images of the work piece within the spin coating bowl for quality control and work piece positioning. An annular array of light sources are surrounding sides of the spin coating bowl and are configured to illuminate the interior of the spin coating bowl for optical controls. The vision system may be utilized for both quality control and work piece positioning. The coating nozzle is configured to move between a first coating position vertically aligned with the work piece, and a second purge position vertically aligned with the recirculation drain.

19 Claims, 6 Drawing Sheets

U.S. PATENT DOCUMENTS

| | | |
|---|---|---|
| 2002/0108561 A1 | 8/2002 | Davis |
| 2002/0112662 A1 | 8/2002 | Yamauchi et al. |
| 2002/0197400 A1 | 12/2002 | Kao et al. |
| 2003/0079679 A1 | 5/2003 | Ikeda et al. |
| 2003/0180444 A1 | 9/2003 | Takekuma et al. |
| 2004/0072450 A1 | 4/2004 | Collins et al. |
| 2005/0037272 A1 | 2/2005 | Tanaka |
| 2006/0090848 A1 | 5/2006 | Koga et al. |
| 2007/0076301 A1 | 4/2007 | Couto et al. |
| 2007/0107657 A1 | 5/2007 | Hoffmann |

FOREIGN PATENT DOCUMENTS

| | | |
|---|---|---|
| JP | 2001-269609 A | 10/2001 |

\* cited by examiner

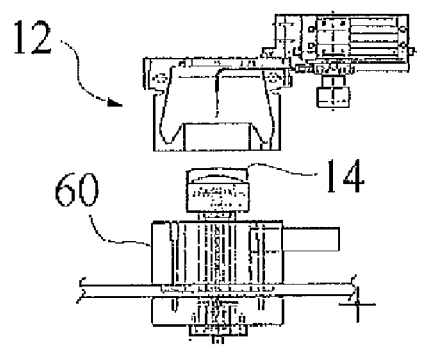
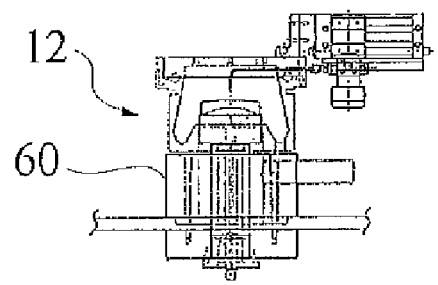
Fig. 4A
Fig. 4B
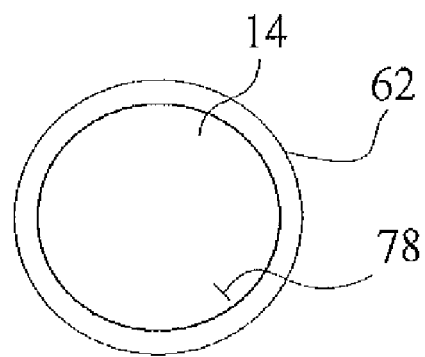
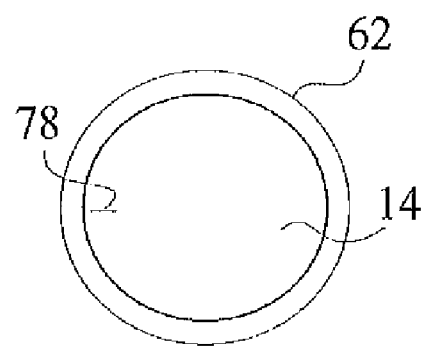
Fig. 5A
Fig. 5B

RECIRCULATION SPIN COATER WITH OPTICAL CONTROLS

RELATED APPLICATIONS

The present application claims the benefit of U.S. Patent Application Ser. No. 60/823,695 filed Aug. 28, 2006 entitled "RECIRCULATION SPIN COATER WITH MINIMAL COATING MATERIAL LOSS AND OPTICAL CONTROLS AND METHOD OF SPIN COATING."

BACKGROUND OF THE INVENTION

1. Field of the Invention

The present invention relates to spin coaters and methods of spin coating. More particularly the present invention is directed to recirculation spin coaters with minimal coating material loss and optical controls and methods of spin coating.

2. Background Information

Spin coating processes and associated spin coating machines are well known for efficiently providing a uniform coating to a substrate work piece. In particular lenses and wafers have used spin coating processes for the application of the completed lens and coating of wafers.

U.S. Published patent application serial number 20030079679 discloses a spin coater for dropping a chemical liquid onto a wafer W supported by the support table, whereas a front end part of the arm is provided with a nozzle for letting out the chemical liquid and the arm is horizontally rotatable by the driving motor.

U.S. Published patent application serial number 20020197400 discloses a spin-coater for coating a liquid material on a wafer that is equipped with a self-cleaning coating cup and a method for self-cleaning a spin-coater. The spin-coater is constructed of a coating cup of circular shape, a wafer pedestal situated in the cup, a coating material dispensing nozzle over the pedestal, a motor means for rotating the pedestal, and a solvent dispensing means that is mounted juxtaposed to an upper rim of the sidewall of the cup for dispensing a cleaning solvent onto an interior surface of the sidewall to dissolve and rinse off any liquid coating material splattered thereon and to prevent the formation of solid contamination from the solidified coating material.

U.S. Published patent application serial number 20020112662 discloses a waste fluid separation and recovery system for a spin coater including an exhaust airflow generator for generating an exhaust airflow.

U.S. Published patent application serial number 20070107657 discloses a device for spin-coating substrates. U.S. Published patent application serial number 20070076301 discloses a process for coloring an optical lens by spin coating which comprises (i) increasing or decreasing the temperature of at least one zone of the lens surface by at least 2° C. and (ii) simultaneously, or successively, depositing a colored coating comprising a volatile solvent over the entire surface of the lens by spin coating.

U.S. Published patent application serial number 20040072450 discloses methods and apparatuses useful for spin-coating process solutions onto substrates, wherein the methods and apparatuses incorporate a pressure sensor to detect the pressure of a process solution, such as a pressure related to a beginning or end of a dispense of process solution from a dispenser; some preferred methods and apparatuses measure pressure of a photoresist, developer, water, solvent, or cleaner in a dispense line; and some preferred methods and apparatuses incorporate process control systems involving interrupted, parallel control methods.

U.S. Published patent application serial number 20020108561 discloses an apparatus and methods for use in spin coating a coating material onto a wafer. The apparatus includes a rotatable chuck capable of supporting the wafer and a bowl having a bottom and a side defining an interior region, the bottom containing an opening through which the chuck is movable and separable from the bowl.

U.S. Pat. No. 6,352,747 discloses a spin and spray coating process for curved surfaces, particularly lenses. See also U.S. Pat. Nos. 6,326,054 and 6,129,042 disclosing a process and machine for coating optical lenses.

Methods for producing uniform coatings on substrates have been disclosed in numerous patents. U.S. Pat. No. 3,494,326 describes a spin-coating machine that includes a sealed compartment and means for providing a pressure differential in the area of the spinning lens. The controlled withdrawal and flow of air around the spinning lens due to the pressure differential reportedly enables providing a uniform coating on certain elongated lens shapes.

U.S. Pat. No. 5,094,884 describes an apparatus for applying a uniform layer of a fluid material on a substrate by using a dispensing nozzle having a rectangular or oblong shaped opening. The fluid material is dispensed while the nozzle moves along a radial path inwardly from the peripheral edge of the substrate.

U.S. Pat. No. 5,246,499 describes a coating system for applying a scratch-resistant coating to plastic ophthalmic lenses. The coating station of this system includes a coating arm assembly having nozzles which can be moved radially inwardly and outwardly over spinning lenses to apply the coating solution.

U.S. Pat. No. 5,514,214 describes an apparatus for and method of applying a UV curable monomer to the surface of an ophthalmic lens or mold. The substrate is sprayed with a UV curable solution while spinning at a high rate of speed to achieve a uniform coating. The coated substrate is then moved to a curing chamber to polymerize the monomer on the lens or mold.

U.S. Pat. No. 5,571,560 describes a method of coating a substrate that minimizes waste using a proximity dispenser that dispenses a liquid coating in the form of a stream from nozzles placed from 5 to 10 mm above the substrate.

U.S. Pat. No. 5,685,908 describes an apparatus for coating multifocal lens elements. The coating solution is applied using a nozzle that may be tilted while the lens is spun about an axis offset from the geometric center.

U.S. Pat. No. 5,766,354 describes a spin-coating device having the means to position the substrate at a predetermined angle while the fluid coating is dropped onto the rotating substrate.

Existing spin coaters do not effectively minimize coating material loss. Existing spin coaters do not effectively address work piece position for subsequent processing, which is particularly important for the manufacture of certain optical lenses. Existing spin coaters do not effectively address spin coater controls, particularly within a substantially closed spin coater environment. Existing spin coaters with a closed environment do not adequately address all coating materials. It is the objects of the present invention to generally improve spin coaters and methods of spin coating, to address the deficiencies of the prior art discussed above, and to do so in an efficient cost effective manner.

SUMMARY OF THE INVENTION

It is noted that, as used in this specification and the appended claims, the singular forms "a," "an," and "the" include plural referents unless expressly and unequivocally limited to one referent. For the purposes of this specification, unless otherwise indicated, all numbers expressing any parameters used in the specification and claims are to be understood as being modified in all instances by the term "about." All numerical ranges herein include all numerical values and ranges of all numerical values within the recited numerical ranges. The numerical ranges and parameters setting forth the broad scope of the invention are approximations, but are reported as precisely as possible.

The various embodiments and examples of the present invention as presented herein are understood to be illustrative of the present invention and not restrictive thereof and are non-limiting with respect to the scope of the invention.

According to one embodiment of the present invention addressing at least one of the above stated objects, a recirculation spin coater system comprises a source of coating material, a spin coating bowl adapted to receive a work piece to be coated therein, wherein the spin coating bowl includes a substantially closed top portion and a work piece access opening on a bottom facing portion of the spin coating bowl, a coating nozzle adapted to be coupled to the source of coating material, and a wetting fluid chamber associated with the upper end of the inner side walls. The work piece to be coated is mounted for rotation within the spin coating bowl, wherein the spin coating bowl has a recirculation drain therein that is configured to allow coating material to be recovered from the spin coating bowl and configured to return the recovered coating material to the source of coating material. The wetting fluid chamber is configured to dispense a side wall wetting fluid to inner side walls of the spin coating bowl at least during operation of the nozzle.

According to one embodiment of the present invention a spin coater system comprises a spin coating bowl adapted to receive a work piece to be coated therein, and a vision system configured to capture images of the work piece within the spin coating bowl. The work piece to be coated is mounted for rotation within the spin coating bowl.

According to one embodiment of the present invention the spin coater system comprises a spin coating bowl adapted to receive a work piece to be coated therein, and an annular array of light sources surrounding sides of the spin coating bowl. The work piece to be coated is mounted for rotation within the spin coating bowl, and the annular array of light sources is configured to illuminate the interior of the spin coating bowl for optical controls.

In one embodiment of the present invention a recirculation spin coater system comprises a source of coating material, a spin coating bowl, and a coating nozzle. The spin coating bowl is adapted to receive a work piece to be coated therein and includes a substantially closed top portion and a work piece access opening on a bottom facing portion of the spin coating bowl. The work piece to be coated is mounted for rotation within the spin coating bowl. The spin coating bowl has a recirculation drain therein that is configured to allow coating material to be recovered from the spin coating bowl and is configured to return the recovered coating material to the source of coating material. The coating nozzle is adapted to be coupled to the source of coating material. The coating nozzle includes at least two operable positions, a first operable position which is configured to dispense coating material to the work piece within the spin coating bowl and a second operable position which is configured to dispense coating material to the recirculation drain to be recovered.

These and other advantages of the present invention will be clarified in the description of the preferred embodiments taken together with the attached figures wherein like reference numerals represent like elements throughout.

BRIEF DESCRIPTION OF THE DRAWINGS

FIGS. 4A and B illustrate the relative positions of a work piece holding chuck and spin coating bowl of the spin coater according to the present invention during work piece loading and unloading;

FIGS. 5A and B illustrate sample work piece images for work piece orientation;

DESCRIPTION OF THE PREFERRED EMBODIMENTS

Figure 1:
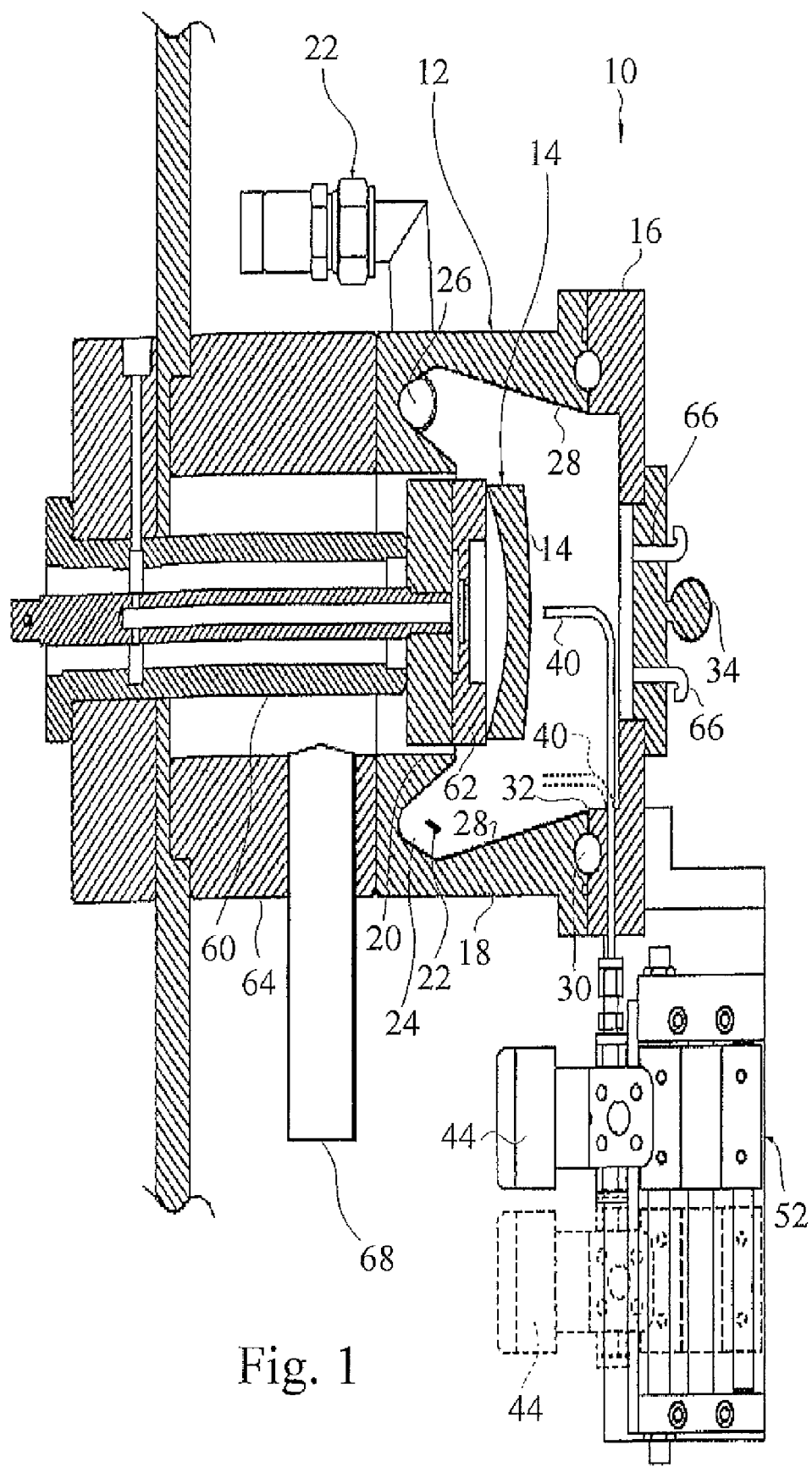
FIG. 1 is a side section view of a portion of a recirculation spin coater that controls the coating environment in accordance with one non-limiting embodiment according to the present invention.
Figure 2:
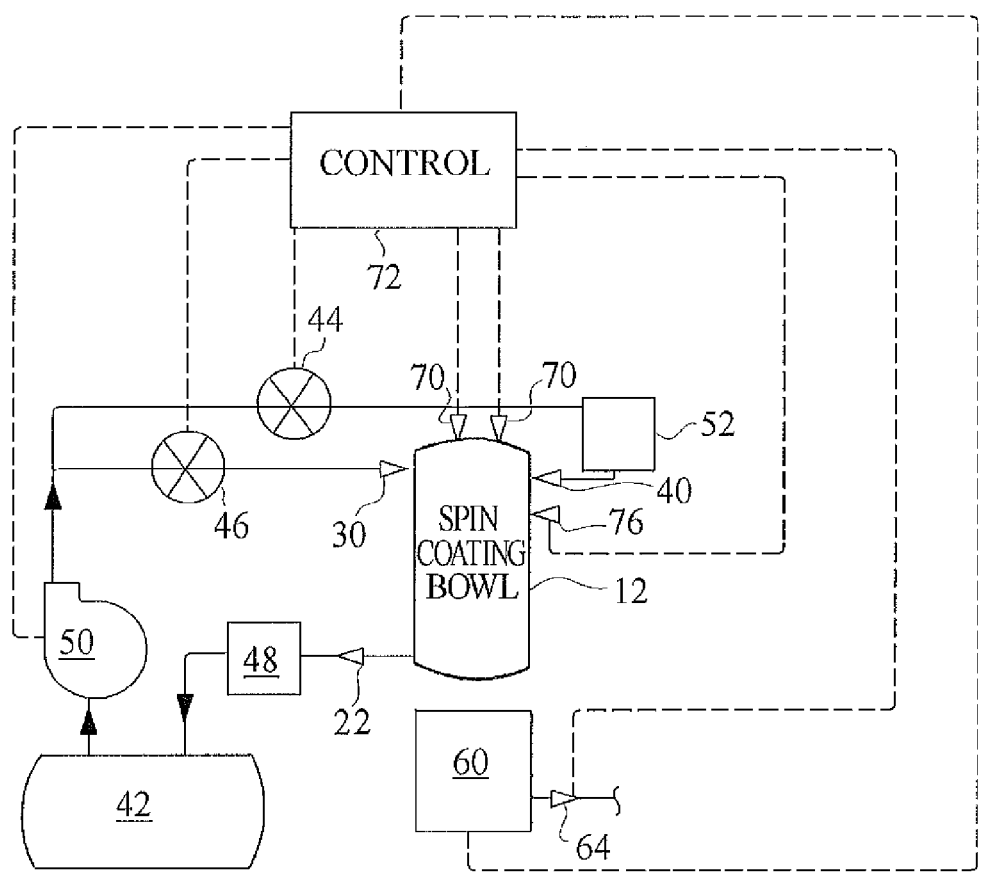
FIG. 2 is a schematic diagram of the recirculation spin coater of FIG. 1.

The FIGS. 1-2 illustrate one embodiment of a recirculation spin coater 10 that minimizes coating material loss in a closed solvent rich environment in accordance with one embodiment according to the present invention.

The spin coater includes a spin coating bowl 12 adapted to receive a work piece 14 to be coated therein. The spin coating bowl 12 includes a substantially closed top portion 16 and a base or bottom portion 18 with a work piece access opening 20 on a bottom facing portion of the spin coating bowl 12. This provides a substantially closed, occluded environment within the spin coating bowl 12 that is useful for maintaining a solvent rich environment that is not subject to direct ambient lighting to assist in minimizing the loss of certain coating materials.

The spin coating bowl 12 has a recirculation drain 22 therein that is configured to allow coating material to be recovered from the spin coating bowl 12. The recirculation drain 22 includes an annular trough 24 surrounding the work piece access opening 20 and at least one drain opening 26 extending to the annular trough 24. The trough 24 includes sloped sides that direct and concentrate the fluid received therein at the bottom of the trough 24 and the trough 24 may even be sloped in the annular direction toward the drain opening 26 to further assist the fluid circulation through the spin coating bowl 12, however adequate recirculation of most coating materials is achieved with a substantially horizontal bottom of the trough 24 which shape is generally somewhat easier for manufacturing.

The spin coating bowl 12 includes generally planar, diverging inner side walls 28 in the base or bottom portion 18 that diverge in a radial outward direction extending from the upper end to the lower end of the spin coating bowl 12, as shown. The diverging side walls 28 may assist in minimizing splatter of the cast off coating material from the coated work piece 14 during operation, which will increase the amount of coating material recovered and may minimize any detrimental effects to the coating on the work piece 14. Although planar diverging side walls 28 are shown, a diverging convex configuration, diverging concave configuration or combinations thereof could also be designed for the diverging side walls 28.

The side walls 28 are designed to have a fluid flow, called a side wall wetting fluid, down the surface thereof during operation to maintain a solvent rich environment within the spin coating bowl 12 and to prevent the coating material cast off from the work piece 14 from crystallizing, or setting, upon contact with the side walls 28. These features will combine to minimize the loss of coating material in the recirculation process. The angle of the diverging side walls 28 will not be greater than will allow for a laminar surface flow along the surface of the side walls 28. Surface tension of the wetting fluid will allow for some degree of divergence as shown. Typically the degree of divergence will be on the order of 0-30 degrees.

Although diverging side walls 28 are shown and described, substantially vertical side walls 28, converging side walls 28 (generally planar, concave, convex or combinations thereof), or even diverging/converging combinations, could be designed without significantly effecting the operation of the spin coater 10 according to the present invention. The optimal side wall design would be one that maximizes coating material recovery while still maintaining an economically reasonable configuration for manufacturing. The illustrated diverging walls 28 are believed to accomplish these goals.

A wetting fluid chamber 30 is associated with the upper end of the inner side walls 28 wherein the wetting fluid chamber 30 is configured to dispense the side wall wetting fluid to the surface of the inner side walls 28 of the spin coating bowl 12. The wetting fluid chamber 30 is an annular chamber around the upper end of the inner side walls 28 with an annular outlet weir 32 around the perimeter of the chamber 30 and side walls 28, whereby the annular chamber 30 is configured receive and dispense the side wall wetting fluid to inner side walls 28 of the spin coating bowl 12. The side wall wetting fluid will be directed to the recirculation drain 22.

In the spin coater 10 the side wall wetting fluid is the same as the coating material which avoids the need to separate the recovered coating material from the wetting fluid that is recovered in the drain 22. However, a side wall coating material that is separate from the coating material, e.g. a solvent carrier, could be used to minimize the amount of coating material flowing through the spin coater 10. If a side wall wetting fluid that is different from the coating material is used then a separation process would need to be added in the fluid recovery loop, and such is not needed in the spin coater 10 that uses the same material for wetting the sides and for coating the work piece 14. The use of the same material is also generally believed to assist in preventing unwanted crystallization or setting of the cast off coating material.

Figure 6:
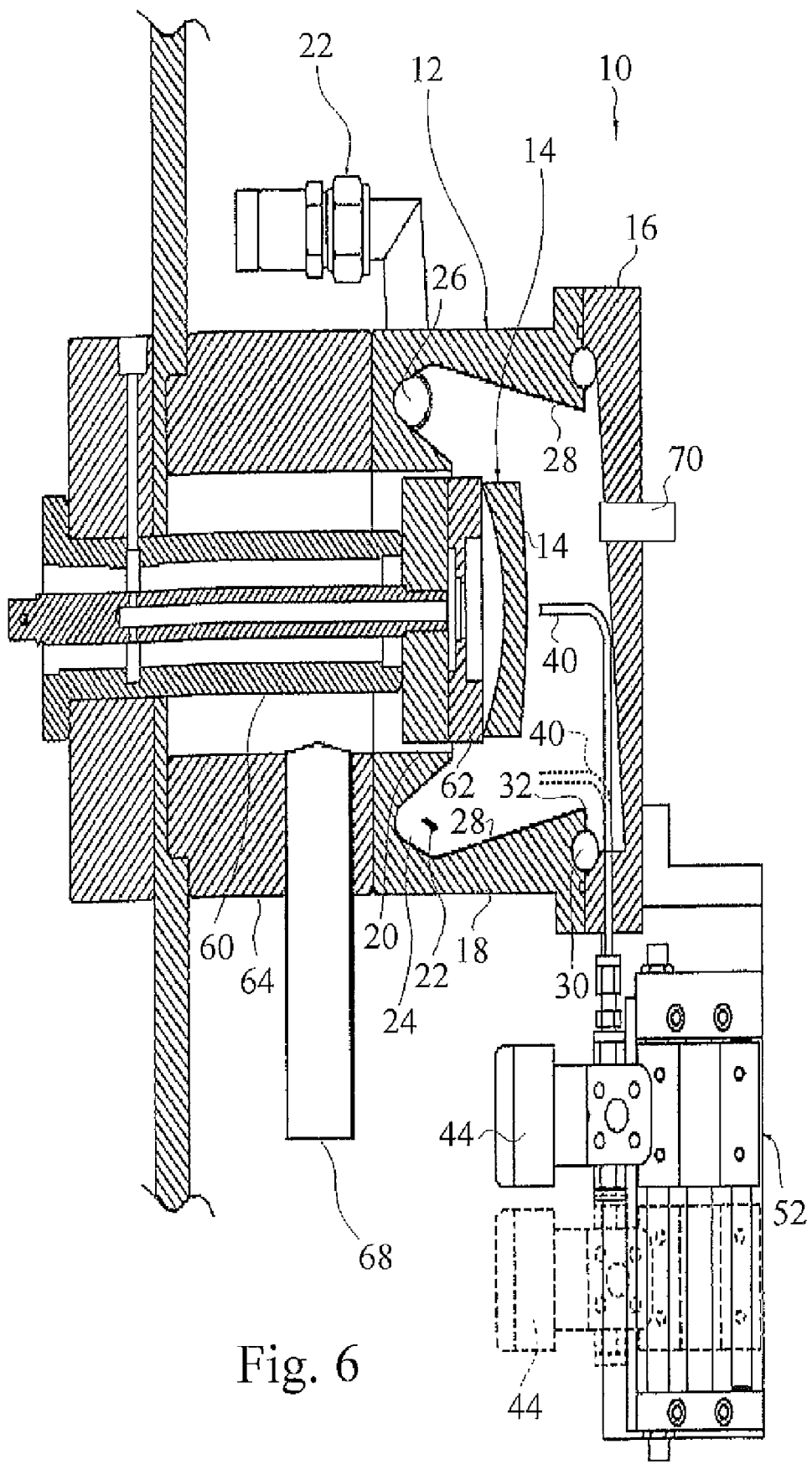
FIG. 6 is a side section view of a portion of a recirculation spin coater in accordance with one non-limiting embodiment according to the present invention.
Figure 7:
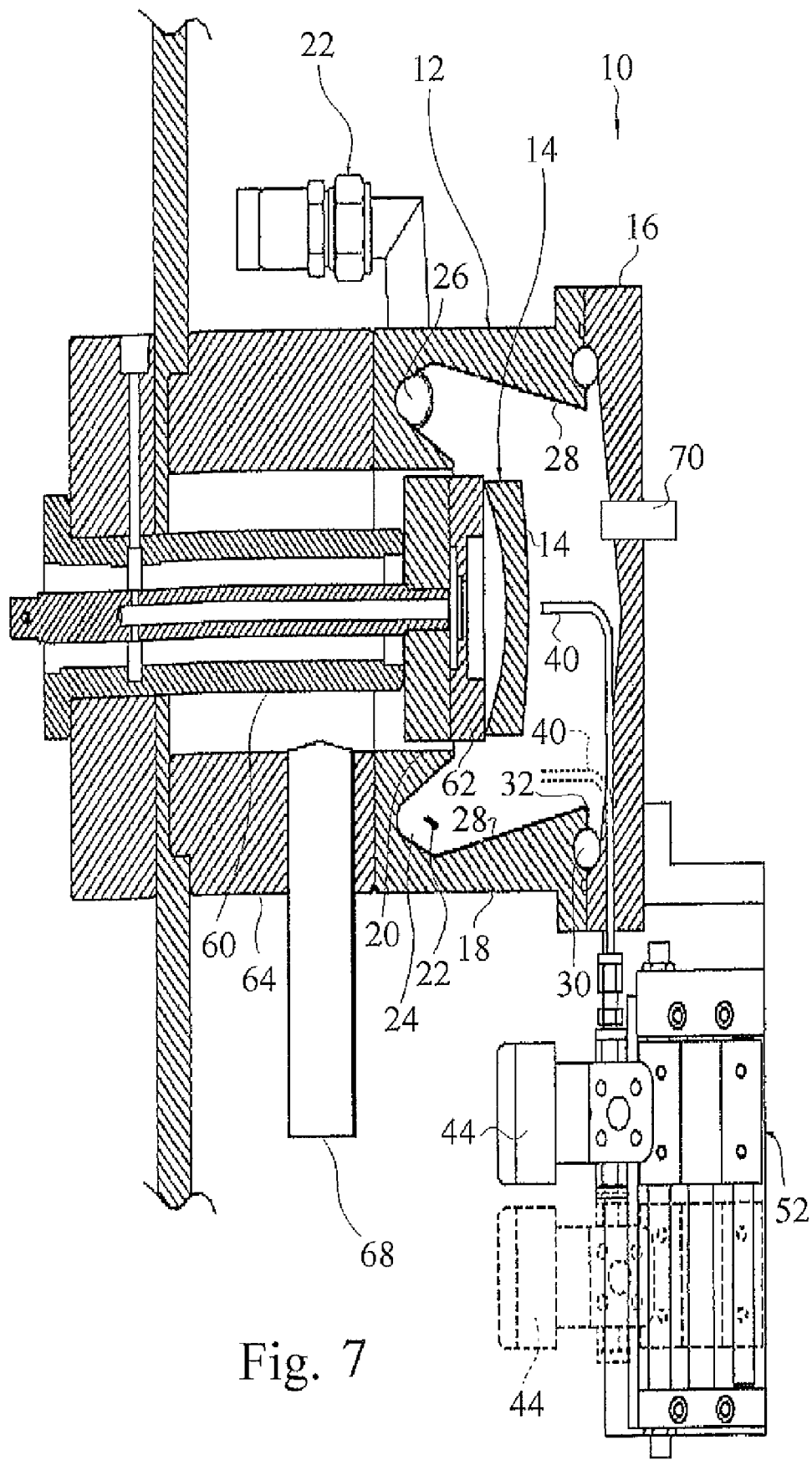
FIG. 7 is a side section view of a portion of a recirculation spin coater in accordance with one non-limiting embodiment according to the present invention.

The spin coating bowl 12 is shown in three assembled pieces, however any convenient number may be used to effectively form the bowl 12. For example, the top portion 16 has a separate cap member 34, as shown, that allows removal of the center cap member 34 to easily access the interior of the bowl 12. The cap member 34 may be removed if the particular coating material does not require the closed environment (e.g. if direct light does not negatively impact the coating material, and/or if an open top bowl 12 is preferred for a particular coating material for increased venting). The top portion 16, may be a one piece structure as shown in FIGS. 6 and 7, for example. Further as shown in FIGS. 6 and 7 the inner surface of the top portion 16 may be sloped toward the drain 22 (or chamber 30 that will flow to drain 22) such that condensate within the chamber will tend to flow along the sloped surface of the top portion to a segment where once it drips from the top portion 16 (if such condensate drips from the top portion 16) the material will avoid the work piece and be directed to the drain 22.

Any conventional material may be used to form the bowl 12. Materials that minimize the sticking of the coating material thereto are desired. A Delrin material has been found to be acceptable for the bowl 12 construction. A translucent material has been found to beneficial for optical controls and illumination necessary for such optical controls as will be described in connection with FIG. 3, with such translucent material still sufficiently preventing direct ambient light from detrimentally effecting light sensitive coating materials. A translucent material such as white Delrin has been found to be particularly useful for the bowl construction however other materials meeting these properties are also acceptable. The material availability and ability to effectively manufacture with the desired bowl material are also critical material selection criteria.

The spin coater 10 includes a coating nozzle 40 which is coupled to the source of coating material 42 through a control valve 44. As discussed above the wetting fluid chamber 30 is also coupled to the source of coating material 42 through control valve 46. The control valves 44 and 46 allow the desired flow of coating material to be directed to the coating nozzle 40 and the wetting fluid chamber 30. It is possible, that for selected coating materials, no flow is provided to the wetting fluid chamber 30 and the control valve 46 is closed during the coating operation. A filter assembly 48 is coupled to the drain 22 to remove contaminants, e.g. partially set coating material, from the recovered coating material. Other recovered material processing elements could be added, as needed, such as a separation device if the side wall coating fluid is different from the coating material. The drain 22 returns the recovered coating material to the source of coating material 42 through the filter assembly 48. A pump 50 will supply the coating material from the source of coating material 42 to the control valves 44 and 46.

The source of coating material 42 may be a reservoir tank structure, as schematically shown, however tubing or conduit from the drain 22 (through filter assembly 48 and pump 50) to the control valves 44 and 46 will also form sufficient structure to be the source of coating material 42, such that a separate reservoir is not required, whereby the trough 24 could be used as holding the desired reserve coating material volume. A separate reservoir tank forming the source of coating material 42 will allow for easy filling or supplying of the system with coating material. A reservoir tank, as shown, may be provided between the filter assembly 48 and the pump 50, or may even be after the pump 50 before the valves 44 and 46 wherein a "gravity feed" system (or even a separate pump) is used to move coating material from the reservoir to the valves 44 and 46.

The coating nozzle 40 extends trough a side wall of the bowl 12 at a position above the annular chamber 30. As shown the nozzle 40 is extending through a side wall forming element of the top portion 16. The nozzle 40 and valve 44 are mounted on a motor actuated slide 52 wherein the coating nozzle 40 includes at least two operable positions, a first operable coating position which is configured to dispense coating material to the work piece 14 within the spin coating bowl 12 and a second operable purge position (shown in phantom) which is configured to dispense coating material directly to the recirculation drain 22 over the trough 24 to be recovered. The drain outlet opening 26 may be configured to be aligned with the purge position of the nozzle 40.

The nozzle 40 may be operated in any position between the two illustrated positions as well. Certain coatings or coating processes may desire a radial moving nozzle 40 during the coating process which is easily accomplished with side wall access coating nozzle 40. The side wall entrance of the nozzle 40 into the interior of the bowl 12 allows for a simple nozzle movement mechanism through slide 52 even with closed bowl 12. Alternative, preferably simple movements are also possible. For example the nozzle 40 may form a radial arm that is pivoted into and out of position. It may be advantageous in such a pivoting arrangement to have the pivot point be outside of the bowl 12 along with the motor and controls. If the nozzle 40 is pivoted and if it extends through the side wall of the bowl 12 then a slot in the side wall would need to be present to accommodate the pivoting motion. Alternatively for a pivoted nozzle 40 configuration the nozzle 40 may extend into the bowl 12 vertically through the top 16 along the pivot axis with the dispensing distal end offset from the pivot axis.

In moving to the purge position it is anticipated that the valve 44 will shut off the flow at least as the nozzle 40 is moving past the radial edge of the work piece 14 and until it is above the trough 24 to minimize loss of coating material.

The purging position allows the nozzle 40 to minimize the stopping of the flow of coating material through the nozzle 40 for any significant amount of time (generally it is only stopped for the time necessary to move the nozzle 40 to the purge position). This continuous (or substantially continuous) flow through the nozzle 40 prevents setting of the coating material within the nozzle 40 that detrimentally effects the coating process and increases coating material loss. The wetting fluid chamber 30, described above, is configured to dispense the side wall wetting fluid to inner side walls 28 of the spin coating bowl 12 at least during operation of the nozzle 40 for selected coating material.

The spin coater 10 includes a rotating work piece holding chuck 60 configured to move into and out of the interior of the spin coating bowl 12 through the work piece access opening as schematically shown in FIGS. 4A and B. The rotating work piece holding chuck 60 includes a vacuum cup 62 for holding the work piece 14 in a conventional fashion. The chuck 60 operates in a conventional fashion and is moved into and out of the bowl 12 as generally shown in FIGS. 4A and B.

An exhaust manifold 64 surrounds the chuck 60 and couples with the access opening when the work piece 14 and chuck 60 are positioned within the bowl 12. The exhaust manifold 64 is coupled to a vacuum source (not shown) through conduit 68. The top portion 16 includes at least one vent 66 therein. The vent 66 and the exhaust manifold 64 allow any desired air flow or venting of the interior to be created during coating even in the closed bowl 12 environment. This structure can be particularly beneficial for coating material that performs better within an enclosed environment (e.g. light sensitive coating material) and which also prefer a highly ventilated environment provided by the exhaust. The vents 66 may be closed when not in use (e.g. a closable valve or a pressure actuated value) or the cap member could be replaced with one not having vents 66 for coating materials not needing venting. Further certain coating materials may benefit from the use of only the open vents 66 in the closed bowl without the exhaust manifold being operated. Further, the exhaust manifold 64 may be utilized without vents 66 such as with the cap member 34 removed (i.e. in an open bowl configuration). The control of the vacuum source will control the desired flow through the bow interior.

Figure 3:
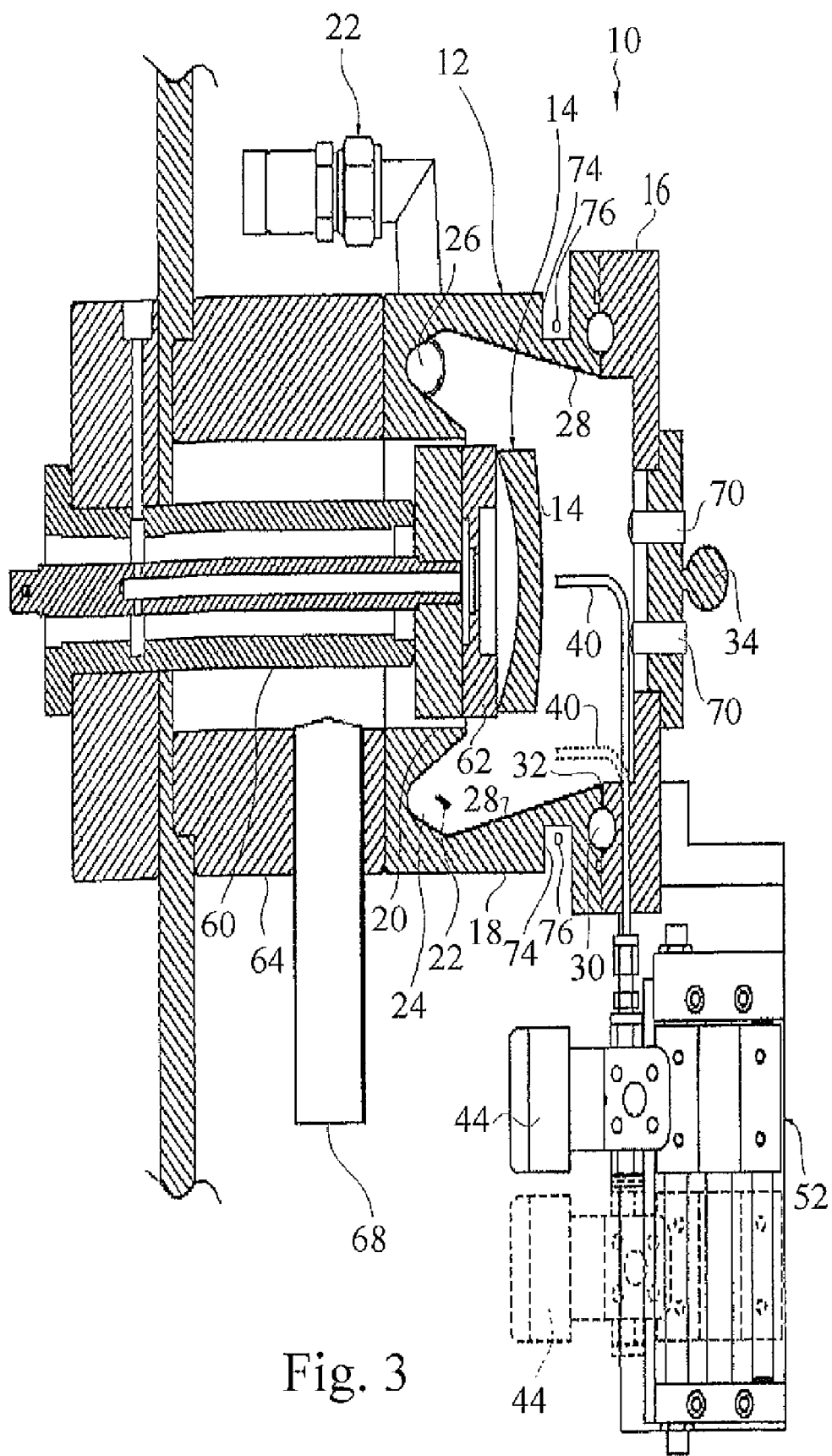
FIG. 3 is a perspective view of a recirculation spin coater in accordance with a modified non-limiting embodiment of the present invention.

FIG. 3 illustrates a modified spin coater 10 according to the present invention. The modified spin coater 10 includes one or more cameras 70 within the bowl 12 that can take images of the interior for optical controls, with the cameras forming the substance of a vision control system. The cameras may be Cognex CCD Insight Inspection cameras, or other suitable visual inspection camera or even optical scanning equipment for controls. The cameras will be coupled to a controller 72. The controller 72 will also control the operation of other aspects of the spin coater 10 to integrate the operation. Therefore the controller 72 is coupled to the coating nozzle 40, control valves 44 and 46, slide 52, pump 50, vacuum source (for both the exhaust manifold 64 and the chuck 60), chuck motion and rotating mechanism (not shown), and other operable components of the spin coater 10.

For proper operation of the cameras 70 and the associated optical controls the interior of the bowl 12 must be sufficiently illuminated. The level and amount of illumination depends on the particular cameras 70 being utilized (e.g. they may be operable with IR or UV lighting, for example). The bowl 12 includes a groove 74 in an exterior surface thereof with an array of illumination lights 76 mounted in the groove 74. The lights 76 are LED lights, such as a CSC LED light ring using red LED light sources. With this embodiment it becomes critical for the bowl 12 to be formed from a translucent material such that the lights 76 can illuminate the interior. As noted above, white Delrin material is suitable for forming the bowl 12. The side of the bowl 12 in front of the lights 76 (that bounds the groove 74) will act as a light diffuser providing a more even illumination of the bowl interior and improving the optical control operation. The use of the bowl material as a light diffuser also provides the advantage of not needing to mount the lights in a specialized holder that does not interfere with the coating material.

The cameras 70, or other optical scanning devices, allow for a wide variety of optical controls. For example, where the work piece 14 is an optical lens it can be particularly useful to know the work piece orientation for subsequent processing of the coated article (e.g. coated lenses). Determining the work piece orientation within the spin coating bowl 12 can eliminate a subsequent orientation step and orientation device. The cameras 70 have been able to take an image of the work piece 14 in the form of an optical lens (e.g., an eyeglass lens) with rotational identifying laser etching marks 78 thereon and have the controller locate and identify the rotational position of the work piece 14 regardless of the angular location of the marks 78 on the lens as represented in FIGS. 5A and B which are representative of sample images of an etched lens. The process of laser etching lens is known and not described herein. The work pieces 14, particularly optical lenses, may be rotated to a desired rotational orientation by the chuck 60 after the rotational position of the lenses has been determined. Alternatively the work piece transfer mechanism (not shown), such as a robotic loader, can use the determined position to properly position the loader for proper work piece orientation in subsequent steps.

The cameras 70 are not limited to work piece 14 orientation, as described above, but can be utilized to evaluate and control almost any activity within the closed bowl 12 to help automate the entire process. As a non-limiting representative example the vision system can be used to monitor and control the depth of coating material on the work piece 14, the uniformity of a coating layer on the work piece 14, the function of the dispensing nozzle (e.g. confirming whether it is off, on, flowing at the desired rate or in the desired stream), the function of the bowl interior (e.g. are the side walls 28 uniformly wetted with the wetting fluid), the nozzle position (e.g. confirming radial and vertical position), the work piece position (in addition to rotational position), and contamination within the bowl interior. Separate cameras 70 may be used for distinct operational controls or cameras may perform a plurality of control checks. The present invention provides a platform that can be utilized in almost an infinite variety of automated and process control configurations as desired.

FIGS. 6 and 7 illustrate modified spin coaters 10 according to the present invention. As noted above, the top portion 16, may be a one piece structure as shown in FIGS. 6 and 7. The spin coaters 10 of FIGS. 6-7 provide the vision system controlled, closed solvent rich environment spin coater 10 described in connection with FIG. 3. The additional structure or modification illustrated in FIGS. 6 and 7 is that the upper portion of the bowl is a one piece configuration and that the inner surface of the top portion 16 is sloped toward the chamber 30 (that will direct material to drain 22 via the weir 32 and sidewalls) such that condensate within the chamber will tend to flow along the sloped surface of the top portion to a segment where once it drips from the top portion 16 the material will avoid the work piece and be directed, eventually, to the drain 22. FIG. 6 illustrates a continuous slope across the top surface while FIG. 7 illustrates a cone shaped peaked version. Other sloped configurations are of course possible within this concept.

The spin coater 10 of the present invention provides numerous advantages over existing spin coaters. The spin coater 10 provides a significant amount of control to the environment that the coating will experience and improving the coating consistency of the coater 10. The design allows for easy modification of the work piece to nozzle height so that alternative coatings/work pieces can be easily utilized on the coarter 10 with minimal changes.

The spin coater 10 as described provides a method of minimizing coating material loss in a recirculation spin coater system comprising the steps of: A) Providing a recirculation spin coater system having a source of coating material, a coating nozzle adapted to be coupled to the source of coating material and a spin coating bowl having side walls and a recirculation drain therein; B) Mounting a work piece to be coated for rotation and moving the mounted work piece to within the spin coating bowl; C) Directing the nozzle to dispense coating material to the work piece within the spin coating bowl; and D) Directing a flow of wetting fluid to flow along the side walls at least when the nozzle is dispensing coating material to the work piece.

The spin coater 10 also provides a method of spin coating work pieces with coating material recirculation and substantially continuous coating material flow which serves to minimize material loss in the nozzle operation. The method comprises the steps of: A) Providing a recirculation spin coater system having a source of coating material, a coating nozzle adapted to be coupled to the source of coating material and a spin coating bowl having a recirculation drain therein and wherein the spin coating bowl includes a substantially closed top and side portions and includes a work piece access opening on a bottom facing portion of the spin coating bowl; B) Mounting a work piece to be coated for rotation and moving the mounted work piece to within the spin coating bowl; and C) Directing the nozzle to dispense coating material to the work piece within the spin coating bowl; D) Rotating the work piece and coating material; E) Stopping the flow of coating material through the nozzle following coating of the work piece F) Purging the nozzle by dispensing the coating material directly to the recirculation drain to be recovered; and G) Repeating steps C-F for subsequent work pieces.

Further advantages of the spin coater 10 as described above is a method of rotational work piece alignment in a spin coater comprising the steps of A) providing a spin coater system having a spin coating bowl and a vision system configured to capture images of the work piece within the spin coating bowl; B) Mounting a work piece to be coated for rotation and moving the mounted work piece to within the spin coating bowl; C) Supplying the coating material through the coating nozzle to the work piece within the spin coating bowl and rotating the work piece within the spin coating bowl; D) Obtaining an image of the work piece within the spin coating bowl; and E) Determining a rotational position of the work piece within the spin coating bowl.

As noted the vision control system is not limited solely to work piece orientation whereby the spin coater 10 of the present invention provides optical control for a spin coater system in a method comprising the steps of: A) providing a spin coater system having a spin coating bowl, at least one light source for illumination of the spin coating bowl, and a vision system providing optical controls; B) Mounting a work piece to be coated for rotation and moving the mounted work piece to within the spin coating bowl; C) Illuminating the interior of the spin coating bowl with the light source; and D) Using the vision based system on the illuminated interior of the bowl for controlling at least one of the rotational orientation of the work piece, the depth of coating material on the work piece, the uniformity of a coating layer on the work piece, the function of the dispensing nozzle, the function of the bowl interior, the nozzle position, the work piece position, and contamination.

Whereas particular embodiments of this invention have been described above for purposes of illustration, it will be evident to those skilled in the art that numerous variations of the details of the present invention may be made without departing from the invention as defined in the appended claims. The scope of the present invention is intended to be defined by the appended claims and equivalents thereto.

What is claimed is:

1. A spin coater system comprising:
   A spin coating bowl adapted to receive a work piece to be coated therein, wherein the work piece to be coated is mounted for rotation within the spin coating bowl, wherein the spin coating bowl includes a substantially closed top and side portions and a work piece access opening on a bottom facing portion of the spin coating bowl, and wherein the spin coating bowl includes diverging inner side walls that diverge in a radial outward direction extending from the upper end to the lower end of the spin coating bowl;
   a source of coating material;
   a coating nozzle adapted to be coupled to the source of coating material;
   A wetting fluid chamber associated with the upper end of the inner side walls wherein the wetting fluid chamber is configured to dispense a side wall wetting fluid to inner side walls of the spin coating bowl at least during operation of the nozzle, and wherein the wetting fluid chamber is an annular chamber around the upper end of the inner side walls which is coupled to the source of coating material, whereby the coating material also forms the side wall wetting fluid; and
   A vision system configured to capture images of the interior of the spin coating bowl.

2. The spin coater system according to claim 1 further comprising a rotating work piece holding chuck configured to move into and out of the interior of the spin coating bowl, wherein the rotating work piece holding chuck includes a vacuum cup for holding the work piece and a controller configured to position the chuck in precise rotational orientations.

3. The spin coater system according to claim 1 further including a rotating work piece holding chuck, wherein the chuck is configured to move into and out of the work piece access opening.

4. The spin coater system according to claim 3 further including at least one light source configured to illuminate the interior of the spin coating bowl.

5. The spin coater system according to claim 4 wherein the light source includes an annular array of light sources surrounding sides of the spin coating bowl.

6. The spin coater system according to claim 5 wherein the annular array of light sources is configured to diffuse light through at least a portion of the sides of the spin coating bowl to illuminate the interior of the spin coating bowl.

7. The spin coater system according to claim 6 wherein the vision system is configured to determine the rotational orientation of the work piece.

8. The spin coater system according to claim 7 further comprising a controller configured to position the chuck in precise rotational orientations.

9. The spin coater system according to claim 3 wherein the vision system includes a camera mounted in the top portion of the spin coating bowl.

10. A spin coater system comprising:
A spin coating bowl adapted to receive a work piece to be coated therein, wherein the work piece to be coated is mounted for rotation within the spin coating bowl, wherein the spin coating bowl includes a substantially closed top and side portions and a work piece access opening on a bottom facing portion of the spin coating bowl, and wherein the spin coating bowl includes diverging inner side walls that diverge in a radial outward direction extending from the upper end to the lower end of the spin coating bowl;
A coating nozzle adapted to be coupled to the source of coating material;
A wetting fluid chamber associated with the upper end of the inner side walls wherein the wetting fluid chamber is configured to dispense a side wall wetting fluid to inner side walls of the spin coating bowl at least during operation of the nozzle, and wherein the wetting fluid chamber is an annular chamber around the upper end of the inner side walls which is coupled to the source of coating material, whereby the coating material also forms the side wall wetting fluid; and
An annular array of light sources surrounding sides of the spin coating bowl configured to illuminate the interior of the spin coating bowl for optical controls.

11. The spin coater system according to claim 10 further including a work piece holding chuck, wherein the chuck is configured to move into and out of the work piece access opening.

12. The spin coater system according to claim 10 wherein the annular array of light sources is configured to diffuse light through at least a portion of the sides of the spin coating bowl to illuminate the interior of the spin coating bowl.

13. The spin coater system according to claim 10 further including an integrated vision system, wherein the vision system includes a camera mounted in the top portion of the spin coating bowl.

14. A recirculation spin coater system comprising:
A source of coating material;
A spin coating bowl adapted to receive a work piece to be coated therein, the spin coating bowl includes a substantially closed top portion and a work piece access opening on a bottom facing portion of the spin coating bowl, wherein the work piece to be coated is mounted for rotation within the spin coating bowl, the spin coating bowl having a recirculation drain therein that is configured to allow coating material to be recovered from the spin coating bowl and configured to return the recovered coating material to the source of coating material, wherein the spin coating bowl includes diverging inner side walls that diverge in a radial outward direction extending from the upper end to the lower end of the spin coating bowl;
A coating nozzle adapted to be coupled to the source of coating material; and
A wetting fluid chamber associated with the upper end of the inner side walls wherein the wetting fluid chamber is configured to dispense a side wall wetting fluid to inner side walls of the spin coating bowl at least during operation of the nozzle, and wherein the wetting fluid chamber is an annular chamber around the upper end of the inner side walls which is coupled to the source of coating material, whereby the coating material also forms the side wall wetting fluid.

15. The recirculation spin coater of claim 14 wherein the recirculation drain includes an annular trough surrounding the work piece access opening and at least one drain opening coupled to the source of coating material and extending to the annular trough.

16. The recirculation spin coater of claim 14 wherein the coating nozzle includes at least two operable positions, a first operable coating position which is configured to dispense coating material to the work piece within the spin coating bowl and a second operable purge position which is configured to dispense coating material directly to the recirculation drain to be recovered.

17. The recirculation spin coater of claim 14 further including an annular array of light sources for illumination of the interior of the spin coating bowl.

18. The recirculation spin coater of claim 17 further including a camera configured to capture images of the work piece within the spin coating bowl for determination of work piece orientation.

19. The recirculation spin coater of claim 18 wherein the array of light sources are spaced from the interior of the spin coating bowl by at least a portion of the sides of the spin coating bowl, whereby this portion forms a diffuser for the light sources.

* * * * *